United States Patent
He et al.

(10) Patent No.: US 10,372,168 B1
(45) Date of Patent: Aug. 6, 2019

(54) COOLING SYSTEM FOR REMOVABLE NON-VOLATILE MEMORY DRIVE

(71) Applicant: Dell Products L.P., Round Rock, TX (US)

(72) Inventors: Qinghong He, Austin, TX (US); Todd Delton Grabbe, Cedar Park, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 0 days.

(21) Appl. No.: 15/913,148

(22) Filed: Mar. 6, 2018

(51) Int. Cl.
*G06F 1/16* (2006.01)
*G06F 1/20* (2006.01)
*H05K 7/20* (2006.01)

(52) U.S. Cl.
CPC .......... *G06F 1/1658* (2013.01); *G06F 1/203* (2013.01); *H05K 7/20172* (2013.01); *H05K 7/20336* (2013.01)

(58) Field of Classification Search
CPC ............................ G06F 1/1658; H05K 5/0286
USPC ............................ 361/679.46, 679.31–679.39
See application file for complete search history.

(56) References Cited

U.S. PATENT DOCUMENTS

| 7,448,921 | B2 * | 11/2008 | Kim ..................... G06K 7/0013 361/715 |
| 2012/0134098 | A1 * | 5/2012 | Homer ................... G06F 1/20 361/679.33 |

* cited by examiner

*Primary Examiner* — Mukundbhai G Patel
(74) *Attorney, Agent, or Firm* — Baker Botts L.L.P.

(57) ABSTRACT

An information handling system may include a removable non-volatile memory module, including a non-volatile memory drive and a guide rail, and a module cage configured to receive the removable module. The module cage may include a thermal pad and a guide rail mating feature into which the guide rail of the removable module is inserted during installation to maneuver the removable module into an operating position. The guide rail mating feature may prevent the removable module from contacting the thermal pad until the removable module reaches, or nears, its operating position, at which point a wedge feature of the guide rail mating feature may press the removable module downward to contact the thermal pad. The thermal pad may include an abrasion resistance overlay. The module cage may include a metal plate below the thermal pad coupled to a heat pipe that directs heat toward a fan housing.

16 Claims, 5 Drawing Sheets

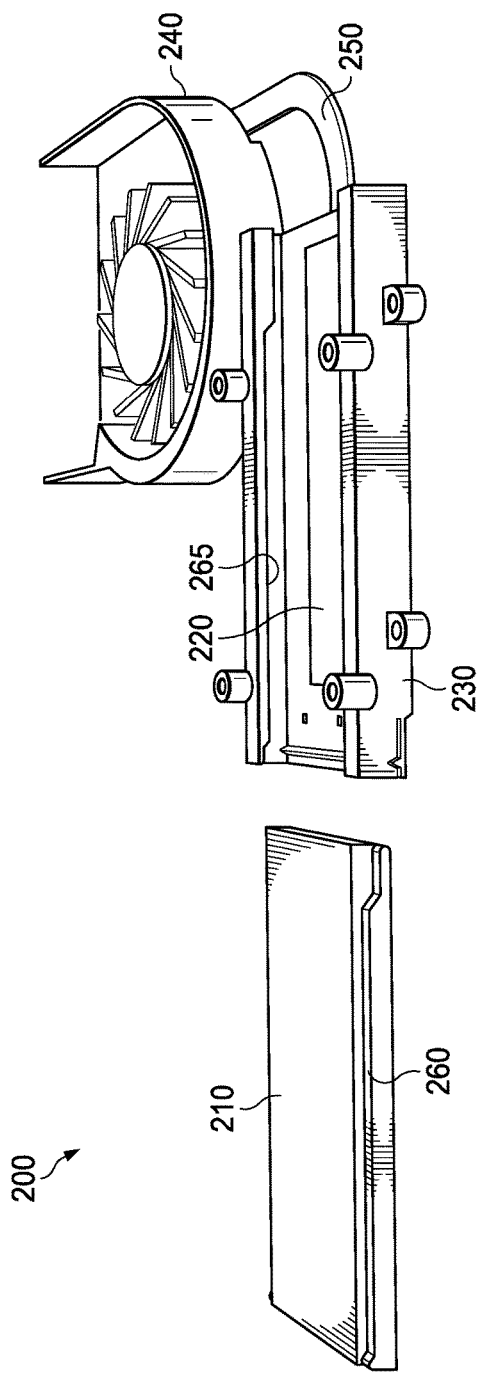
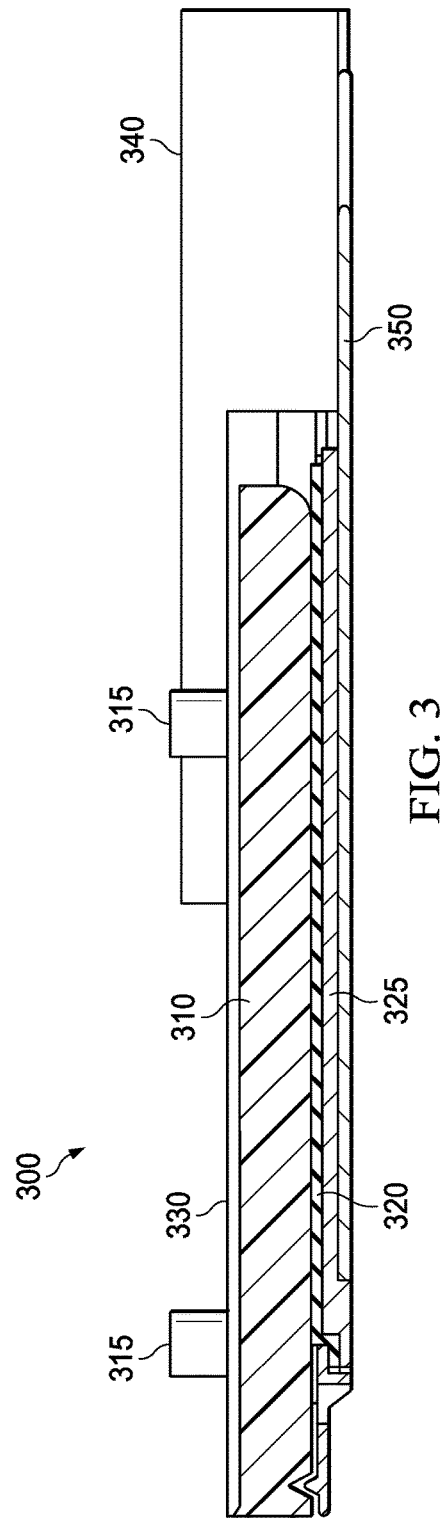

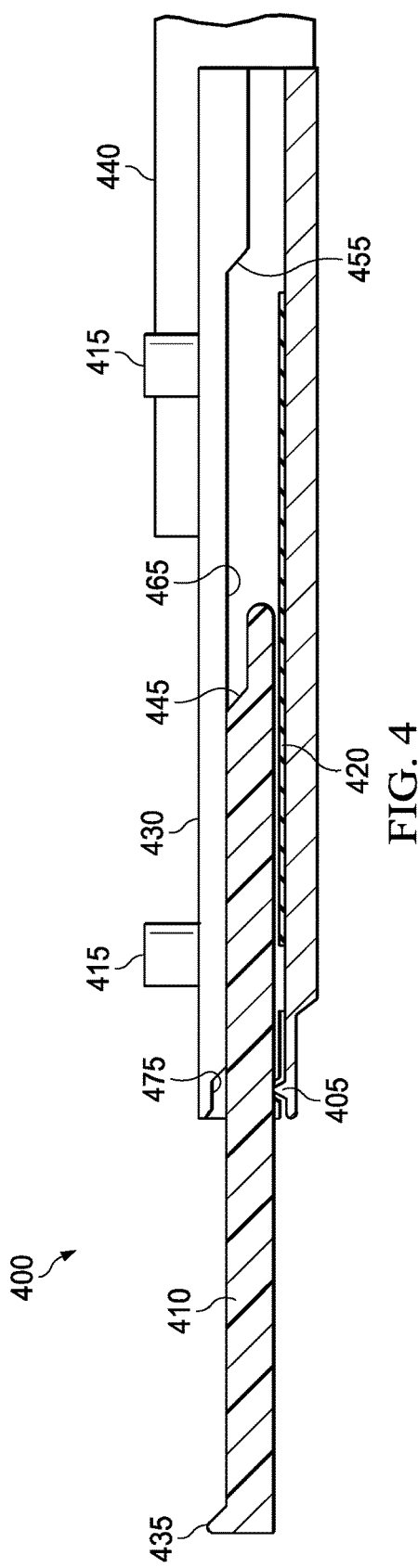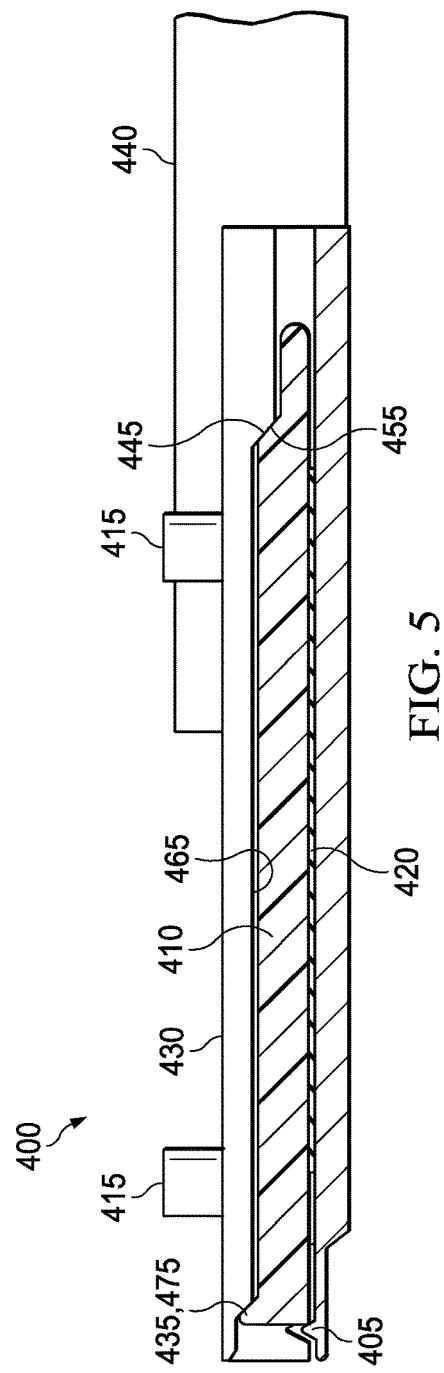

COOLING SYSTEM FOR REMOVABLE NON-VOLATILE MEMORY DRIVE

BACKGROUND

Field of the Disclosure

This disclosure relates generally to information handling systems and, more particularly, to cooling systems for removable non-volatile memory drives.

Description of the Related Art

As the value and use of information continues to increase, individuals and businesses seek additional ways to process and store information. One option available to users is information handling systems. An information handling system generally processes, compiles, stores, and communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Examples of information handling systems include portable devices such as laptop computers, notebook computers, media players, personal data assistants, digital cameras, cellular phones, cordless phones, smart phones, tablet computers, and 2-in-1 tablet-laptop combination computers. A portable device may generally be any device that a user may carry for handheld use and that includes a processor. Typically, portable devices are powered using a rechargeable battery and include a display device. Some portable information handling systems include detachable components, such as keyboards, or are themselves detachable from other components, such as docking stations. Some portable information handling systems are designed for operation in harsh environments, such as environments in which they are subject to strong vibrations, extreme temperatures, or wet or dusty conditions. Some portable information handling systems are rated for their ruggedness in accordance with military testing specifications or other industry standards.

SUMMARY

In one aspect, a disclosed information handling system may include a removable non-volatile memory module, the removable non-volatile memory module including a non-volatile memory drive and a guide rail. The information handling system may also include a module cage installed in the information handling system and configured to receive the removable non-volatile memory module. The module cage may include a thermal pad and a guide rail mating feature into which the guide rail of the removable non-volatile memory module is inserted during installation of the removable non-volatile memory module in the module cage to maneuver the removable non-volatile memory module into an operating position. When the guide rail of the removable non-volatile memory module travels over a first portion of the guide rail mating feature prior to the removable non-volatile memory module reaching the operating position, the guide rail mating feature may prevent the removable non-volatile memory module from contacting the thermal pad. When the removable non-volatile memory module reaches the operating position, the guide rail mating feature may cause the removable non-volatile memory module to contact the thermal pad.

In any of the disclosed embodiments, the thermal pad may include a thermally conductive interface layer to conduct heat away from the removable non-volatile memory module when the removable non-volatile memory module is installed in the module cage, and an abrasion resistance overlay covering the thermally conductive interface layer. When the removable non-volatile memory module reaches the operating position, the guide rail mating feature may cause the removable non-volatile memory module to contact the abrasion resistance overlay of the thermal pad.

In any of the disclosed embodiments, the abrasion resistance overlay may include brass, brass plated steel, beryllium copper, a heat-resistant polyester resin, polytetrafluoroethylene, or copper foil.

In any of the disclosed embodiments, the module cage may further include a metal plate below and in contact with the thermal pad, and a heat pipe physically coupled to the metal plate to direct heat away from the thermal pad.

In any of the disclosed embodiments, the information handling system may further include a fan housing, and the heat pipe may be physically coupled to the fan housing to direct heat from the module cage toward the fan housing.

In any of the disclosed embodiments, the metal plate may include an aluminum sheet.

In any of the disclosed embodiments, the guide rail of the removable non-volatile memory module may include a wedge feature positioned at the leading edge of the guide rail during installation of the removable non-volatile memory module in the module cage. The guide rail mating feature of the module cage may include a wedge mating feature at an end of the guide rail mating feature proximate the operating position. When the removable non-volatile memory module reaches the operating position, the wedge mating feature of the guide rail mating feature may exert a force on the wedge feature of the guide rail causing the removable non-volatile memory module to be pressed downward and to contact the thermal pad.

In any of the disclosed embodiments, the module cage may further include a flexible tab at an end of the guide rail mating feature opposite the operating position configured to press upward on the removable non-volatile memory module as the removable non-volatile memory module passes over the flexible tab during installation of the removable non-volatile memory module in the module cage.

In any of the disclosed embodiments, the removable non-volatile memory module may further include a lip feature positioned opposite the leading edge of the guide rail during installation of the removable non-volatile memory module in the module cage, and the module cage may further include a lip mating feature configured to retain the lip feature of the removable non-volatile memory module when the removable non-volatile memory module is in the operating position.

In another aspect, a disclosed module cage for retaining a removable non-volatile memory module may include a thermal pad, and a guide rail mating feature into which a guide rail of the removable non-volatile memory module is inserted during installation of the removable non-volatile memory module in the module cage to maneuver the removable non-volatile memory module into an operating position. When the guide rail of the removable non-volatile memory module travels over a first portion of the guide rail mating feature prior to the removable non-volatile memory module reaching the operating position, the guide rail mating feature may prevent the removable non-volatile memory module from contacting the thermal pad. When the removable non-volatile memory module reaches the operating position, the guide rail mating feature may cause the removable non-volatile memory module to contact the thermal pad.

In any of the disclosed embodiments, the thermal pad may include a thermally conductive interface layer to conduct heat away from the removable non-volatile memory module when the removable non-volatile memory module is installed in the module cage, and an abrasion resistance overlay covering the thermally conductive interface layer. When the removable non-volatile memory module reaches the operating position, the guide rail mating feature may cause the removable non-volatile memory module to contact the abrasion resistance overlay of the thermal pad.

In any of the disclosed embodiments, the abrasion resistance overlay may include brass, brass plated steel, beryllium copper, a heat-resistant polyester resin, polytetrafluoroethylene, or copper foil.

In any of the disclosed embodiments, the module cage may further include a metal plate below and in contact with the thermal pad, and a heat pipe physically coupled to the metal plate to direct heat away from the thermal pad.

In any of the disclosed embodiments, the heat pipe may be physically coupled to a fan housing to direct heat from the module cage toward the fan housing.

In any of the disclosed embodiments, the metal plate may include an aluminum sheet.

In any of the disclosed embodiments, the guide rail mating feature of the module cage may include a wedge mating feature at an end of the guide rail mating feature proximate the operating position. When the removable non-volatile memory module reaches the operating position, the wedge mating feature of the guide rail mating feature may exert a force on a wedge feature of the guide rail positioned at the leading edge of the guide rail during installation of the removable non-volatile memory module in the module cage causing the removable non-volatile memory module to be pressed downward and to contact the thermal pad.

In any of the disclosed embodiments, the module cage may further include a flexible tab at an end of the guide rail mating feature opposite the operating position configured to press upward on the removable non-volatile memory module as the removable non-volatile memory module passes over the flexible tab during installation of the removable non-volatile memory module in the module cage.

In any of the disclosed embodiments, the module cage may further include a lip mating feature configured to retain a lip feature of the removable non-volatile memory module positioned opposite the leading edge of the guide rail during installation of the removable non-volatile memory module in the module cage when the removable non-volatile memory module is in the operating position.

BRIEF DESCRIPTION OF THE DRAWINGS

For a more complete understanding of the present invention and its features and advantages, reference is now made to the following description, taken in conjunction with the accompanying drawings, in which:

FIG. 2 illustrates an embodiment of a cooling system for a removable non-volatile memory drive of an information handling system;

FIG. 3 is a side view of selected elements of an embodiment of a cooling system for a removable non-volatile memory drive of an information handling system including a thermal pad with an abrasion resistance overlay;

FIG. 4 is a side view of selected elements of an embodiment of a cooling system for a removable non-volatile memory drive of an information handling system following a partial insertion of the drive into the information handling system;

FIG. 5 is a side view of selected elements of an embodiment of a cooling system for a removable non-volatile memory drive of an information handling system following installation of the drive into the information handling system;

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and flash memory, such as a solid-state drive (SSD) comprising solid-state flash memory; as well as communications media such wires, optical fibers, microwaves, radio waves, and other electromagnetic or optical carriers; or any combination of the foregoing.

Particular embodiments are best understood by reference to FIGS. 1-8 wherein like numbers are used to indicate like and corresponding parts.

Figure 1:
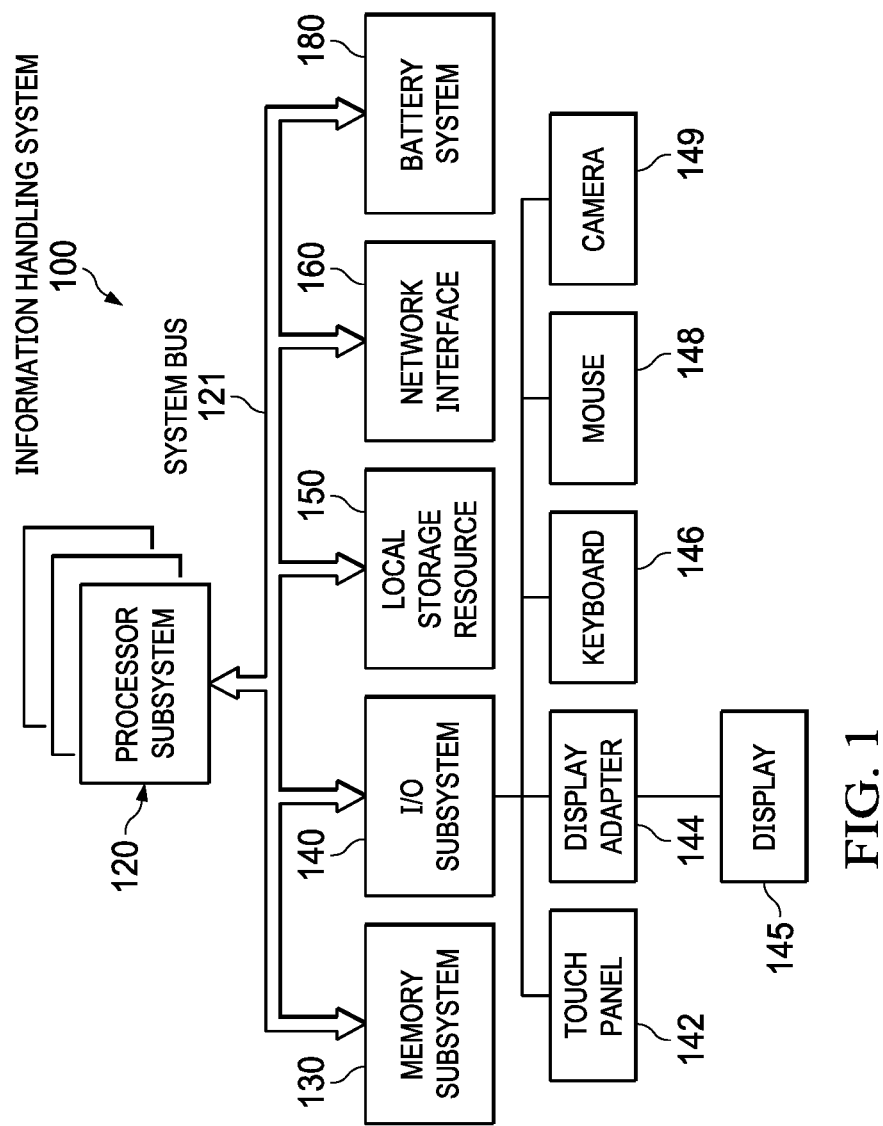
FIG. 1 is a block diagram of selected elements of an embodiment of an information handling system.

Turning now to the drawings, FIG. 1 illustrates a block diagram depicting selected elements of an embodiment of an information handling system 100. In various embodiments, information handling system 100 may represent different types of portable devices.

As shown in FIG. 1, components of information handling system 100 may include, but are not limited to, processor subsystem 120, which may comprise one or more processors, and system bus 121 that communicatively couples various system components to processor subsystem 120 including, for example, a memory subsystem 130, an I/O subsystem 140, local storage resource 150, a network interface 160, and battery system 180. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus. Battery system 180 may represent a rechargeable battery and related components included with information handling system 100.

In FIG. 1, network interface 160 may be a suitable system, apparatus, or device operable to serve as an interface between information handling system 100 and a network (not shown). Network interface 160 may enable information handling system 100 to communicate over the network using a suitable transmission protocol or standard. In some embodiments, network interface 160 may be communicatively coupled via the network to a network storage resource (not shown). The network coupled to network interface 160 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). The network coupled to network interface 160 may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. The network coupled to network interface 160 or various components associated therewith may be implemented using hardware, software, or any combination thereof.

As depicted in FIG. 1, processor subsystem 120 may comprise a system, device, or apparatus operable to interpret and execute program instructions and process data, and may include a microprocessor, microcontroller, digital signal processor (DSP), application specific integrated circuit (ASIC), or other digital or analog circuitry configured to interpret and execute program instructions and process data. In some embodiments, processor subsystem 120 may interpret and execute program instructions and process data stored locally (e.g., in memory subsystem 130). In the same or alternative embodiments, processor subsystem 120 may interpret and execute program instructions and process data stored remotely (e.g., in a network storage resource).

Also in FIG. 1, memory subsystem 130 may comprise a system, device, or apparatus operable to retain and retrieve program instructions and data for a period of time (e.g., computer-readable media). Memory subsystem 130 may comprise random access memory (RAM), electrically erasable programmable read-only memory (EEPROM), a PCM-CIA card, flash memory, magnetic storage, opto-magnetic storage or a suitable selection or array of volatile or non-volatile memory that retains data after power is removed. Local storage resource 150 may comprise computer-readable media (e.g., hard disk drive, floppy disk drive, CD-ROM, and other type of rotating storage media, flash memory, EEPROM, or another type of solid-state storage media) and may be generally operable to store instructions and data.

In information handling system 100, I/O subsystem 140 may comprise a system, device, or apparatus generally operable to receive and transmit data to, from or within information handling system 100. I/O subsystem 140 may represent, for example, a variety of communication interfaces, graphics interfaces, video interfaces, user input interfaces, and peripheral interfaces. As shown, I/O subsystem 140 may comprise touch panel 142, display adapter 144, keyboard 146, touch pad 148, and camera 149. In other embodiments, I/O subsystem 140 may include more, fewer, or different input/output devices or components. Touch panel 142 may include circuitry for enabling touch functionality in conjunction with a display device, shown as display 145, that is driven by display adapter 144. Camera 149 may represent any of a variety of imaging devices, such as a video camera, infrared camera, or combinations thereof.

In various embodiments of information handling system 100, such as portable devices or so-called all-in-one devices, display 145 may be mechanically integrated with other components. Furthermore, touch panel 142 may be integrated into display 145 such that a touch user interface is provided to a user. The touch user interface typically coincides with a pixel space of display 145 such that touch inputs correspond to certain display pixels, which may present user interface elements, such as buttons, menus, input fields, etc., to the user.

In some embodiments, one or more of the devices or components shown within I/O subsystem 140 may be detachable from information handling system 100. For example, in embodiments in which information handling system 100 is a portable information handling system, such as a laptop computer or a tablet computing device, keyboard 146 may be detachable from the information handling system. In some embodiments in which information handling system 100 is a portable information handling system, the information handling system may be detachable from a docking station or base.

In some embodiments, local storage resource 150 may be implemented as a removable non-volatile memory module, such as a removable SSD module. The removable non-volatile memory module may be inserted (i.e., installed, at least temporarily) in information handling system 100 and subsequently removed multiple times. For example, the removable non-volatile memory module may be repeatedly inserted into and removed from a module cage that is permanently installed within information handling system 100. Examples of such module cages are illustrated in FIGS. 2-5 and described below.

In some embodiments, information handling system 100 may be a rugged portable information handling system, such as a laptop computer or Internet-of-Things (JOT) application that meets one or more ruggedness standards defined for such devices. In accordance with particular standards, in order for an SSD module of information handling system 100 to be considered rugged, it may be required to support up to 10,000 cycles of tool-less insertion and removal in order to retrieve data or store it at a secure location in mission critical applications. At the same time, the industry is increasingly moving toward the use of high performance and high power SSD modules that implement the NVM Express (NVMe) communications interface/protocol developed for SSD modules. In both rugged and IOT applications, the NVMe module may not have access to forced airflow due to requirements defined by the standards. The combination of ruggedness requirements in these applications (e.g., that the module support a high number of tool-less removals/insertions, high power, e.g., up to 8 W, and high performance, without the benefit of moving air) makes the problem of cooling SSD modules while meeting both thermal and mechanical requirements especially challenging. In at least some embodiments, the cooling systems for removable non-volatile memory drives described herein may meet these and other ruggedness standards.

In some existing systems, when an information handling system, or SSD module thereof, operates in a high ambient temperature environment and/or when the operation (and resulting power dissipation) of the information handling system or SSD itself causes the temperature of the SSD module to rise above a particular temperature threshold, an automatic throttling mechanism may be triggered to reduce the read and/or write speeds of the SSD module dramatically in order to reduce the power dissipation of the SSD module, allowing the SSD module to cool down. However, throttling the SSD module significantly, and negatively, impacts the performance of the SSD module. In the worst case, such throttling may reduce the performance of the SSD module by up to about 85 percent. Existing NVMe modules, which are typically cooled with forced air, may operate at temperatures only up to about 35° C. In some embodiments of the information handling systems described herein, the cooling system may allow a removable non-volatile memory drive to operate at temperatures up to and including 63° C. (ambient) without throttling.

In some embodiments, the information handling systems and removable non-volatile memory modules thereof described herein may operate in compliance with ruggedness requirements (specifically, electrical enclosure ratings) specifying that no forced air passes over the module. For example, Ingress Protection (IP) ratings are based on intrusion protection and moisture protection, with the first digit of the IP rating representing an intrusion protection rating and the second digit of the IP rating representing a moisture protection rating. Example intrusion protection ratings include: 1) no special protection; 2) protection from a large part of the body or from solid objects greater than 50 mm in diameter; 3) protection against fingers or other object not greater than 80 mm in length and 12 mm in diameter; 4) protection from entry by tools or wires with a diameter of 2.5 mm or more; 5) protection against solid bodies larger than 1 mm (e.g., fine tools, small instruments); 6) protected against dust that may harm equipment; and 7) totally dust tight. Example moisture protection ratings include: 1) no protection; 2) protection against condensation; 3) protection against water droplets deflected up to 15° from vertical; 4) protection against spray up to 60° from vertical; 5) protection against water spray from all directions; 6) protection against low pressure water jets (all directions); 7) protection against strong water jets and waves; 8) protected against temporary immersion; and 9) protected against prolonged effects of immersion under pressure.

Common IP ratings for rugged laptop computers, IOT applications, or other information handling systems, according to the ratings standards described above, include, for example: IP65, in which an electrical enclosure is rated as dust tight and protected against water projected from a nozzle; IP66, in which an electrical enclosure is rated as dust tight and protected against heavy seas or powerful jets of water; IP67, in which an electrical enclosure is rated as dust tight and protected against immersion; and IP68, in which an electrical enclosure is rated as dust tight and protected against complete, continuous submersion in water.

In an information handling system with a removable non-volatile memory module that adheres to one of these ruggedness standards, e.g., IP65, a requirement that the module be removable (which implies the need for some amount of clearance around the module during insertion and removal), together with the need for thermal conduction (which is not compatible with the aforementioned requirement for gaps) and a requirement that there is no airflow around the module (which implies the need for the module to be in contact with another component that conducts heat away from the module), complicates the design of a cooling system for the removable non-volatile memory module.

In some embodiments, an information handling system may include a high power, removable SSD module placed in a module enclosure (also referred to as a module cage) that includes a ramping feature. The ramping feature, referred to herein as a guide rail mating feature, mates to a guide rail on the removable SSD module to maneuver the removable SSD module such that while the removable SSD module is being inserted into the module cage, the removable SSD module does not make contact with the module cage (nor with a thermal pad thereof) until it reaches or nears the end of its travels toward its installed position (i.e., its operating position). Once the removable SSD module reaches its operating position, the guide rail mating feature may exert a downward force on the removable SSD module so that the bottom surface of the removable SSD module comes in contact with a thermal pad installed in the module cage. In at least some embodiments, the thermal pad may include an abrasion resistance overlay to protect the thermal pad during repeated insertions and removals of the removable SSD module. In at least some embodiments, a metal plate may be installed in the module cage beneath the thermal pad and may be soldered to a heat pipe. The heat pipe may carry the heat away from the module cage (and, thus, the removable SSD module) to a remote location to be rejected to the air. For example, the remote location toward which the heat is conducted may be a fan housing installed in the information handling system. The cooling system elements described herein, taken individually and/or collectively, in various combinations, may enable a removable SSD module to meet the both the high cycle count requirements for mechanical insertions/removals and the cooling requirements of high power SSD modules imposed by various operating standards.

FIG. 2 illustrates an embodiment of a cooling system 200 for a removable non-volatile memory drive of an information handling system, such as information handling system 100 illustrated in FIG. 1. In this example embodiment, cooling system 200 includes removable SSD module 210, module cage 230 into which removable SSD module 210 is to be installed, heat pipe 250, and fan housing 240. Several of the components of cooling system 200 are further illustrated in one or more of FIGS. 3-5, in accordance with particular embodiments, and described in more detail in reference to those figures.

Module cage 230 may be manufactured from a plastic material and may be installed permanently in the information handling system. Module cage 230 may be slightly deeper than removable SSD module 210, which is slightly deeper than an SSD device (an actual non-volatile memory drive or card within removable SSD module 210), all of which may vary in size between different embodiments dependent on the amount of memory, the memory technology, the materials used to construct the SSD drive and/or the removable SSD module, the features supported by the SSD drive and/or the removable SSD module, including any applicable thermal, mechanical, or ruggedness specifications or other factors. In one example embodiment, the SSD drive within removable SSD module 210 may have dimensions of approximately 22 mm×80 mm. In this example, removable SSD module 230 may have dimensions of approximately 30 mm×100 mm. The thickness of removable SSD module 230 may be approximately five or six mm, and the thickness of module cage 230 may be on the order of 12 mm, due in large part to the additional materials installed in its interior (e.g., thermal pad 220, which may include an abrasion resistance overlay and/or an underlying metal plate).

In the illustrated example, removable SSD module 210 includes two parallel module guide rails 260, one on each side of removable SSD module 210. Module cage 230 includes two parallel guide rail mating features 265 which are mated to the module guide rails 260 during the insertion of removable SSD module 210 into module cage 230. Module cage 230 also includes thermal pad 220 which, when removable SSD module 210 is installed in module cage 230, serves as a thermally conductive interface between removable SSD module 210 and the interior portion of module cage 230, specifically, the bottom of module cage 230, as illustrated.

Heat pipe 250 may be made of a material that is highly thermally conductive. In the illustrated example, heat pipe 250 may be capable of transferring up to 8 W of heat from removable SSD module 210 at 63° C. to fan housing 240 for rejection to the air through fan housing 240, although 5 W may be more typical in practice. As described in more detail below in reference to FIG. 3, in some embodiments, a metal plate may be installed in module cage 230 below thermal pad 220 and may be coupled (e.g., soldered) to heat pipe 250. In such embodiments, removable SSD module 210 may first dissipate heat through thermal pad 220. Thermal pad 220 may conduct the heat to the metal plate, after which the metal plate conducts the heat to heat pipe 250, which further conducts the heat toward fan housing 240. Fan housing 240 may then reject the heat to the air.

In certain embodiments, an abrasion resistance overlay may cover thermal pad 220 to protect thermal pad 220 from damage during repeated insertions and removals of removable SSD module 210. The overlay material may be selected in order to optimize the friction coefficient, thermal conduction, and abrasion resistance of thermal pad 220. For example, materials suitable for the overlay may include, but are not limited to, brass, brass plated steel, beryllium copper, a heat-resistant polyester resin, polytetrafluoroethylene, or copper foil. The overlay material may be chosen based on the specific thermal performance and/or abrasion resistance specifications for a given application. For example, a brass overlay might exhibit very good abrasion resistance and also very good heat transfer properties in many application. A heat-resistant polyester resin may exhibit very good abrasion resistance and low friction (force) characteristics, but might have relatively poor thermal performance when compared to other overlay materials. However, the thermal performance of the heat-resistant polyester resin may be adequate for certain applications.

FIG. 3 is a side view of selected elements of an embodiment of a cooling system 300 for a removable non-volatile memory drive of an information handling system including a thermal pad with an abrasion resistance overlay. In this example embodiment, cooling system 300 includes module cage 330, removable SSD module 310, multiple standoffs 315, thermal pad 320, metal plate 325, heat pipe 350, and fan housing 340. In FIG. 3, removable SSD module 310 is shown in its operating position following insertion in module cage 330. Removable SSD module 310 may be similar to removable SSD module 210 illustrated in FIG. 2 and may include parallel guide rail features that mate with guide rail mating features within module cage 330 during the insertion of removable SSD module 310 in module cage 330 (not shown). During insertion, removable SSD module 310 may travel over thermal pad 320, which includes an abrasion resistance overlay, but might not come in contact with thermal pad 320 or its abrasion resistance overlay until it reaches, or nears, its operating position.

In the illustrated embodiment, metal plate 325 may be installed in module cage 330 below thermal pad 320, and may be coupled (e.g., soldered) to heat pipe 350. Heat pipe 350 may conduct heat toward fan housing 340 and provide support for thermal pad 320, which may include a thermally conductive interface layer and an abrasion resistance overlay. The thermally conductive interface layer may be made from a relatively soft and/or flexible thermally conductive interface material. For example, in some embodiments, the thermally conductive interface layer may include a silicone or acrylic elastomer sheet filled with thermally conductive particles, such as thermally conductive ceramic particles. This thermally conductive interface layer may serve to close air gaps between SSD module 310 (which is a heat dissipation source) and a heat sink (such as metal plate 325 installed in module cage 330). In various embodiments, the abrasion resistance overlay within thermal pad 320 may include brass, brass plated steel, beryllium copper, a heat-resistant polyester resin, polytetrafluoroethylene, copper foil, or another suitable thermally conductive, abrasion resistant material.

In the illustrated embodiment, standoffs 315 are mounting features for installing module cage 330 into the chassis of an information handling system by screwing standoffs 315 together with a corresponding mating feature of the chassis, for example.

Module cage 330 may also include mechanical mechanisms to minimize the friction travel length. These mechanical mechanisms, which include a wedge feature of the guide rails and a flexible tab feature of module cage 330, are described in more detail below in reference to FIGS. 4 and 5.

FIG. 4 is a side view of selected elements of an embodiment of a cooling system 400 for a removable non-volatile memory drive of an information handling system following a partial insertion of the drive into the information handling system. In the illustrated embodiment, cooling system 400 includes module cage 430, removable SSD module 410, multiple standoffs 415, thermal pad 420, and fan housing 440, each of which may be similar to elements of the same name and having similar reference numbers illustrated in FIG. 3.

In the illustrated example, removable SSD module 410 includes module guide rails such as module guide rails 260 illustrated in FIG. 2 (not shown) that are mated with corresponding guide rail mating features 465 of module cage 430 during insertion of removable SSD module 410 in module cage 430. As described herein, as the guide rail of removable SSD module 410 travels along the guide rail mating features 465, the guide rail mating features 465 may maneuver removable SSD module 410 toward an operating position within module cage 430 and prevent it from contacting thermal pad 420 until removable SSD module 410 reaches, or nears its operating position resulting in minimum contact and friction between removable SSD module 410 and thermal pad 420 for most of its traveling (e.g., for 90% of more of the length of its travels along the guide rail mating features 465.

In some embodiments, each of the guide rails of removable SSD module 410 includes a wedge feature 445 at one end (e.g., at the leading edge as removable SSD module 410 is inserted in module cage 430) and a lip at the other end. Each of the guide rail mating features 465 may include a wedge mating feature 455 near the operating position, and both a lip mating feature 475 and a tab feature 405 on a side opposite the operating position. When removable SSD module 410 reaches, or nears, the operating position, wedge mating feature 455 may exert a downward force on wedge feature 445, pressing removable SSD module 410 toward thermal pad 420 to cause it to make contact with thermal pad 420. Using this mechanism, there is friction between removable SSD module 410 toward thermal pad 420 only for a very short distance during insertion/removal cycles, reducing the wear on thermal pad 420 and increasing the number of insertion/removal cycles possible.

In the example embodiment illustrated in FIG. 4, module cage 430 includes a flexible tab feature 405. As the leading edge of removable SSD module 410 passes the opening of module cage 430 at the beginning of its insertion into module cage 430 and as removable SSD module 410 travels toward the operating position, tab feature 405 of the module cage may press upward on removable SSD module 410, moving it up and away from thermal pad 420. The flexible tab feature 405 may be a part of, and extend upward from, module cage 430 and, like module cage 430, may be made of a somewhat flexible plastic. Flexible tab feature 405 may exert a fixed, minimal amount of force on removable SSD module 410 as it passes over flexible tab feature 405.

In the example embodiment illustrated in FIG. 4, removable SSD module 410 includes lip feature 435 and module cage 430 includes lip mating feature 475. Once removable SSD module 410 reaches the operating position, lip feature 435 on removable SSD module 410 may slide or snap into position within lip mating feature 475, and may be retained by lip mating feature 475, restricting the movement of removable SSD module 410 during operation.

FIG. 5 is a side view of selected elements of an embodiment of cooling system 400 illustrated in FIG. 4 following installation of a removable non-volatile memory drive into the information handling system. In the illustrated example, removable SSD module 410 is installed in module cage 430 in its operating position, and wedge mating feature 455 exerts a downward force on wedge feature 445, pressing removable SSD module 410 toward thermal pad 420 to cause it to make contact with thermal pad 420. In this position, lip feature 435 is retained by lip mating feature 475, restricting the movement of removable SSD module 410 during operation.

Note that, in some embodiments, when removable SSD module 410 is installed in module cage 430 in its operating position, there may be a slight gap between removable SSD module 410 and the top of module cage 430. However, this may not affect the performance of the cooling system, since there is no gap between removable SSD module 410 and thermal pad 420. Note also that, in some embodiments, module cage 430 may include a door (not shown) that can be closed once removable SSD module 410 is installed in its operating position within module cage 430. The door may include a gasket that seals module cage 430 against the information handling system chassis to keep moisture, dust, or other materials out of module cage 430. For example, in embodiments in which the information handling system and removable SSD module 410 are subject to particular ruggedness requirements, such as a requirement to be IP65 rated, such a door may provide IP65 compliant sealing against the chassis.

Figure 6:
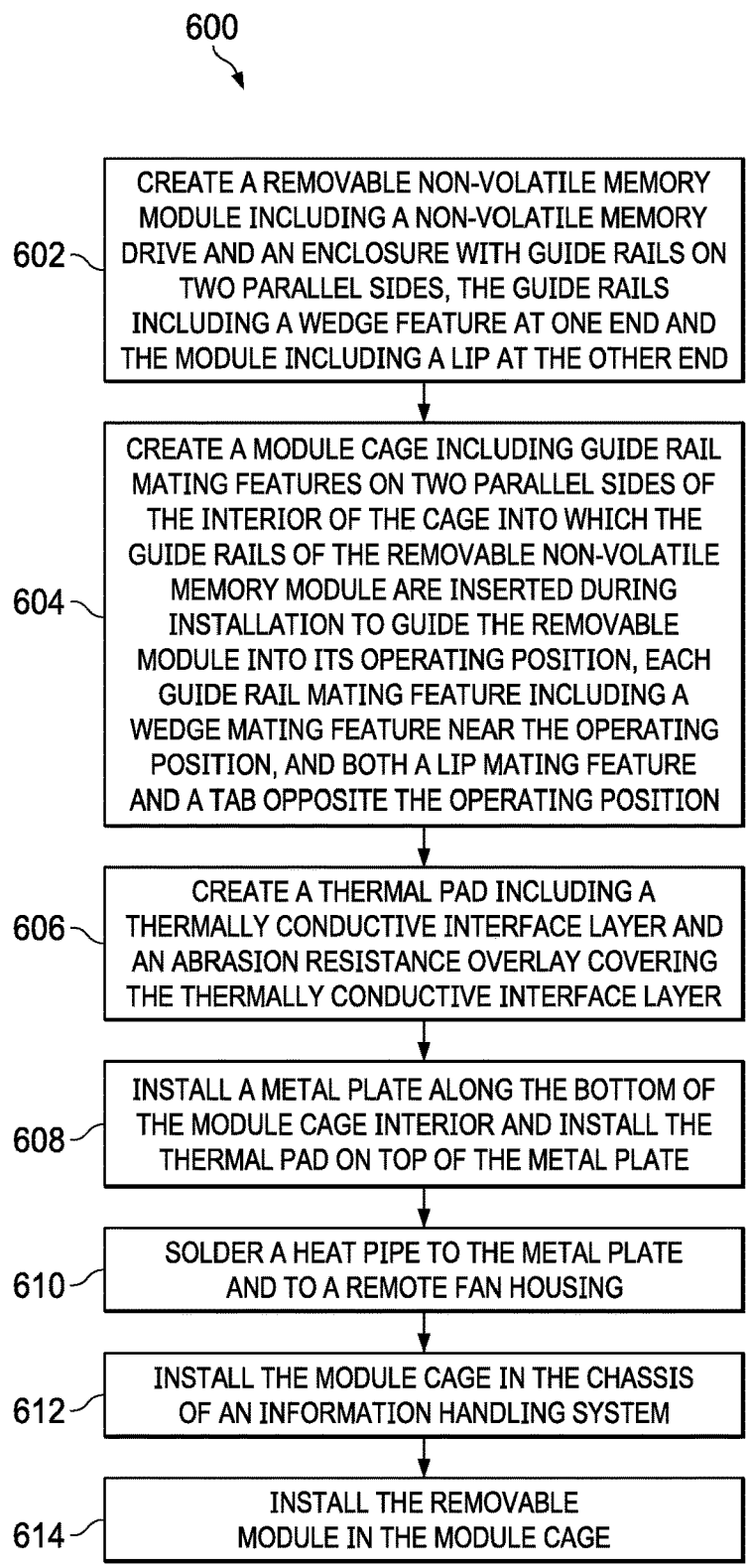
FIG. 6 is a flow diagram illustrating selected elements of an embodiment of a method for assembling a cooling system for a removable non-volatile memory drive of an information handling system.

FIG. 6 is a flow diagram illustrating selected elements of an embodiment of a method 600 for assembling a cooling system for a removable non-volatile memory drive of an information handling system. It is noted that certain operations described in method 600 may be optional or may be performed in a different order than the order illustrated in FIG. 6, in different embodiments. Method 600 may begin, at 602, by creating a removable non-volatile memory module including a non-volatile memory drive and an enclosure with guide rails on two parallel sides along the exterior of the enclosure, the guide rails including a wedge feature at one end and the module including a lip at the other end.

At 604, the method may include creating a module cage including guide rail mating features on two parallel sides of the interior of the cage into which the guide rails of the removable non-volatile memory module are inserted during installation to guide the removable non-volatile memory module into its operating position. Each of the guide rail mating features may include a wedge mating feature near the operating position, and both a lip mating feature and a tab opposite the operating position.

At 606, a thermal pad may be created that includes a thermally conductive interface layer and an abrasion resistance overlay covering the thermally conductive interface layer. At 608, the method may include installing a metal plate along the bottom of the module cage interior to support the thermal pad and couple the thermal pad to a heat pipe, and installing the thermal pad on top of the metal plate.

At 610, a heat pipe may be soldered to the metal plate and to a remote fan housing to conduct heat away from the module cage and toward the fan housing. At 612, the module cage may be installed in the chassis of an information handling system, e.g., using standoffs and screws (as shown in FIGS. 2-5) or using other types of mounting components. At 614, the removable non-volatile memory module may be installed in the module cage, as described herein. An example embodiment of a method for installing the removable non-volatile memory module is illustrated in FIG. 7 and described below.

While FIG. 6 illustrates one example method for assembling a cooling system for a removable non-volatile memory drive of an information handling system, the cooling techniques described herein may be implemented by components that are manufactured and/or assembled using other techniques. For example, a cooling system for a removable non-volatile memory drive of an information handling system may include any subset or combination of the cooling system elements described herein (e.g., the use of guide rails and guide rail mating features to avoid contact with a thermal pad until the removable non-volatile memory drive reaches or nears its operating position, the inclusion of an abrasion resistance overlay on the thermal pad, the use of a heat pipe to conduct heat away from the module cage, etc.) While particular cooling system elements are described as being made from particular materials, they may be manufactured using different materials or combinations of materials, in certain embodiments. In addition, while the cooling system is described in terms of its applicability to a removable SSD module, the disclosed cooling techniques may be applied to cool different types of removable non-volatile memory drives or modules, or other types of heat-generating removable components of information handling systems, in certain embodiments.

Figure 7:
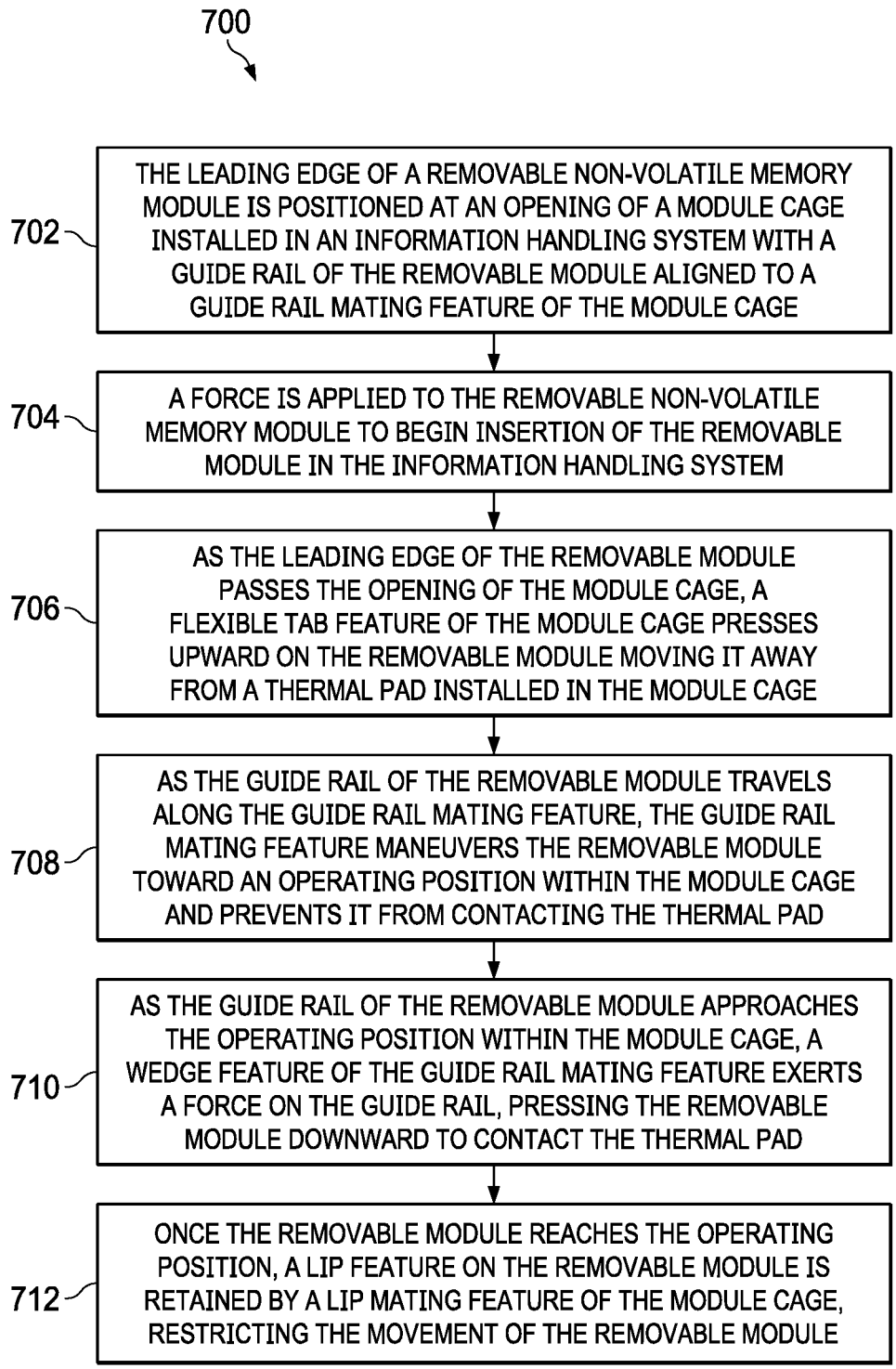
FIG. 7 is a flow diagram illustrating selected elements of an embodiment of a method for installing a removable non-volatile memory drive in an information handling system including a cooling system as described herein.

FIG. 7 is a flow diagram illustrating selected elements of an embodiment of a method 700 for installing a removable non-volatile memory drive in an information handling system including a cooling system as described herein. It is noted that certain operations described in method 700 may be optional or may be performed in a different order than the order illustrated in FIG. 7, in different embodiments. Method 700 may begin, at 702, by positioning the leading edge of a removable non-volatile memory module at an opening of a module cage installed in an information handling system with a guide rail of the removable non-volatile memory module aligned to a guide rail mating feature of the module cage. At 704, the method may include applying a force to the removable non-volatile memory module to begin insertion of the removable non-volatile memory module in the information handling system.

At 706, as the leading edge of the removable non-volatile memory module passes the opening of the module cage, a flexible tab feature of the module cage may press upward on the removable non-volatile memory module moving it away from a thermal pad installed in the module cage. At 708, as the guide rail of the removable non-volatile memory module travels along the guide rail mating feature, the guide rail mating feature may maneuver the removable non-volatile memory module toward an operating position within the module cage and prevent it from contacting the thermal pad installed in the module cage.

At 710, as the guide rail of the removable non-volatile memory module approaches the operating position within the module cage, a wedge feature of the guide rail mating feature may exert a force on the guide rail of the removable non-volatile memory module, pressing the removable non-volatile memory module downward to contact the thermal pad. In one example embodiment, the guide rail mating feature may prevent contact between the removable non-volatile memory module and the thermal pad (or any other portion of the module cage) while the removable non-volatile memory module travels over a first portion of the guide rail mating feature toward its operating position, with the first portion including 90% or more of the path toward the operating position. Once the removable non-volatile memory module reaches the operating position, a lip feature on the removable non-volatile memory module may be retained by a lip mating feature of the module cage, restricting the movement of the removable non-volatile memory module, as in 712.

As described in detail herein, an information handling system may include a removable non-volatile memory module, including a non-volatile memory drive and a guide rail, and a module cage configured to receive the removable module. The module cage may include a thermal pad and a guide rail mating feature into which the guide rail of the removable module is inserted during installation to maneuver the removable module into an operating position. The guide rail mating feature may prevent the removable module from contacting the thermal pad until the removable module reaches, or nears, its operating position, at which point a wedge feature of the guide rail mating feature may press the removable module downward to contact the thermal pad. The thermal pad may include a thermally conductive interface layer and an abrasion resistance overlay that prevents damage to the thermal pad during insertions and removals. The module cage may include a metal plate below the thermal pad coupled to a heat pipe that directs heat toward a fan housing and provides support for the thermal pad, which may be relatively soft and/or flexible.

In a proof-of-concept test of the cooling systems described herein, an abrasion resistance overlay covering a thermal pad was tested to determine whether it could protect the thermally conductive interface layer over 10,000 interactions with an SSD module representing insertion cycles. In this test, the abrasion resistance overlay material was a heat-resistant polyester resin. After 10,000 cycles, the module remained in a good contact with the thermal pad and there was no tearing of the overlay. Thermal simulations of the disclosed cooling techniques also indicated that a cooling system including the guide rail features and abrasion resistance overlays described herein can handle the power dissipation (and resulting heat) of a removable SSD module, when operating at five watts, at ambient temperatures up to 63° C., and with the fan housing operating at maximum fan speed, without throttling.

While several examples of cooling systems are described herein in reference to a removable SSD module of an example information handling system, the disclosed techniques may be used in any applications in which a high power SSD, or other non-volatile memory module, needs to be removable and has little or no access to high speed air flow.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:
1. An information handling system, comprising:
  a removable non-volatile memory module, the removable non-volatile memory module including:
    a non-volatile memory drive; and
    a guide rail;
  a module cage installed in the information handling system and configured to receive the removable non-volatile memory module; the module cage including:
    a thermal pad installed in a fixed position within the module cage;

a guide rail mating feature into which the guide rail of the removable non-volatile memory module is inserted during installation of the removable non-volatile memory module in the module cage to maneuver the removable non-volatile memory module into an operating position, the guide rail mating feature shaped to mate with the guide rail during the installation; and a flexible tab at an end of the guide rail mating feature opposite the operating position configured to press upward on the removable non-volatile memory module as the removable non-volatile memory module passes over the flexible tab during installation of the removable non-volatile memory module in the module cage;

wherein:

when the guide rail of the removable non-volatile memory module travels over a first portion of the guide rail mating feature prior to the removable non-volatile memory module reaching the operating position, the guide rail mating feature prevents the removable non-volatile memory module from contacting the thermal pad; and when the removable non-volatile memory module reaches the operating position, the guide rail mating feature causes the removable non-volatile memory module to contact the thermal pad.

2. The information handling system of claim 1, wherein:
the thermal pad comprises:
a thermally conductive interface layer to conduct heat away from the removable non-volatile memory module when the removable non-volatile memory module is installed in the module cage; and
an abrasion resistance overlay covering the thermally conductive interface layer; and
when the removable non-volatile memory module reaches the operating position, the guide rail mating feature causes the removable non-volatile memory module to contact the abrasion resistance overlay of the thermal pad.

3. The information handling system of claim 2, wherein the abrasion resistance overlay comprises brass, brass plated steel, beryllium copper, a heat-resistant polyester resin, polytetrafluoroethylene, or copper foil.

4. The information handling system of claim 1, wherein the module cage further comprises:
a metal plate below and in contact with the thermal pad; and
a heat pipe physically coupled to the metal plate to direct heat away from the thermal pad.

5. The information handling system of claim 4, wherein:
the information handling system further comprises a fan housing; and
the heat pipe is physically coupled to the fan housing to direct heat from the module cage toward the fan housing.

6. The information handling system of claim 4, wherein the metal plate comprises an aluminum sheet.

7. The information handling system of claim 1, wherein:
the guide rail of the removable non-volatile memory module comprises a wedge feature positioned at the leading edge of the guide rail during installation of the removable non-volatile memory module in the module cage;
the guide rail mating feature of the module cage comprises a wedge mating feature at an end of the guide rail mating feature proximate the operating position; and when the removable non-volatile memory module reaches the operating position, the wedge mating feature of the guide rail mating feature exerts a force on the wedge feature of the guide rail causing the removable non-volatile memory module to be pressed downward and to contact the thermal pad.

8. The information handling system of claim 1, wherein:
the removable non-volatile memory module further comprises a lip feature positioned opposite the leading edge of the guide rail during installation of the removable non-volatile memory module in the module cage; and
the module cage further comprises a lip mating feature configured to retain the lip feature of the removable non-volatile memory module when the removable non-volatile memory module is in the operating position.

9. A module cage for retaining a removable non-volatile memory module, comprising:
a thermal pad installed in a fixed position within the module cage;
a guide rail mating feature into which a guide rail of the removable non-volatile memory module is inserted during installation of the removable non-volatile memory module in the module cage to maneuver the removable non-volatile memory module into an operating position, the guide rail mating feature shaped to mate with the guide rail during the installation; and
a flexible tab at an end of the guide rail mating feature opposite the operating position configured to press upward on the removable non-volatile memory module as the removable non-volatile memory module passes over the flexible tab during installation of the removable non-volatile memory module in the module cage;
wherein:
when the guide rail of the removable non-volatile memory module travels over a first portion of the guide rail mating feature prior to the removable non-volatile memory module reaching the operating position, the guide rail mating feature prevents the removable non-volatile memory module from contacting the thermal pad; and
when the removable non-volatile memory module reaches the operating position, the guide rail mating feature causes the removable non-volatile memory module to contact the thermal pad.

10. The module cage of claim 9, wherein:
the thermal pad comprises:
a thermally conductive interface layer to conduct heat away from the removable non-volatile memory module when the removable non-volatile memory module is installed in the module cage; and
an abrasion resistance overlay covering the thermally conductive interface layer; and
when the removable non-volatile memory module reaches the operating position, the guide rail mating feature causes the removable non-volatile memory module to contact the abrasion resistance overlay of the thermal pad.

11. The module cage of claim 10, wherein the abrasion resistance overlay comprises brass, brass plated steel, beryllium copper, a heat-resistant polyester resin, polytetrafluoroethylene, or copper foil.

12. The module cage of claim 9, wherein the module cage further comprises:
a metal plate below and in contact with the thermal pad; and
a heat pipe physically coupled to the metal plate to direct heat away from the thermal pad.

13. The module cage of claim 12, wherein:
the heat pipe is physically coupled to a fan housing to direct heat from the module cage toward the fan housing.

14. The module cage of claim 12, wherein the metal plate comprises an aluminum sheet.

15. The module cage of claim 9, wherein:
the guide rail mating feature of the module cage comprises a wedge mating feature at an end of the guide rail mating feature proximate the operating position; and
when the removable non-volatile memory module reaches the operating position, the wedge mating feature of the guide rail mating feature exerts a force on a wedge feature of the guide rail positioned at the leading edge of the guide rail during installation of the removable non-volatile memory module in the module cage causing the removable non-volatile memory module to be pressed downward and to contact the thermal pad.

16. The module cage of claim 9, wherein:
the module cage further comprises a lip mating feature configured to retain a lip feature of the removable non-volatile memory module positioned opposite the leading edge of the guide rail during installation of the removable non-volatile memory module in the module cage when the removable non-volatile memory module is in the operating position.

\* \* \* \* \*